US012588176B2

(12) United States Patent　　　　(10) Patent No.:　　US 12,588,176 B2
Zar et al.　　　　　　　　　　　　　(45) Date of Patent:　　　*Mar. 24, 2026

(54) RF SHIELDING POUCH AND GARMENT FOR ELECTRONIC DEVICES

(71) Applicant: SLNT INC., Sheridan, WY (US)

(72) Inventors: Aaron Zar, Aptos, CA (US); Byron Brodowicz, Sheridan, WY (US)

(73) Assignee: SLNT INC, Sheridan, WY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/539,765

(22) Filed: Dec. 14, 2023

(65) Prior Publication Data

US 2024/0324156 A1　　　Sep. 26, 2024

Related U.S. Application Data

(63) Continuation of application No. 18/126,094, filed on Mar. 24, 2023, now Pat. No. 11,871,551.

(51) Int. Cl.
H05K 9/00　　　　(2006.01)
A41D 1/00　　　　(2018.01)

(52) U.S. Cl.
CPC ........... H05K 9/0043 (2013.01); A41D 1/002 (2013.01)

(58) Field of Classification Search
CPC .................................................. H05K 9/0043
See application file for complete search history.

(56)　　　　　　　　References Cited

U.S. PATENT DOCUMENTS

| | | | |
|---|---|---|---|
| 9,414,631 B2 * | 8/2016 | Schrimpf | ............. A41D 27/205 |
| 11,871,551 B1 * | 1/2024 | Zar | ......................... A41D 1/002 |
| 2002/0074142 A1 | 6/2002 | Katz | |
| 2005/0265012 A1 | 12/2005 | Hendrickson | |
| 2007/0034406 A1 | 2/2007 | Schroader | |
| 2009/0067150 A1 | 3/2009 | Ito | |
| 2010/0270070 A1 | 10/2010 | Bradley | |
| 2012/0047631 A1 | 3/2012 | Connolly | |
| 2012/0195530 A1 | 8/2012 | Kennedy | |
| 2013/0220694 A1 | 8/2013 | Wittman-Holloway et al. | |
| 2013/0277101 A1 | 10/2013 | Judy | |
| 2015/0052617 A1 | 2/2015 | Zar | |
| 2016/0143424 A1 * | 5/2016 | Stephens | ................. A45F 3/005 224/676 |
| 2016/0227856 A1 | 8/2016 | Alberth et al. | |
| 2017/0208924 A1 | 7/2017 | Wu | |
| 2023/0210460 A1 * | 7/2023 | Lam | ....................... H01R 24/84 2/167 |

* cited by examiner

*Primary Examiner* — Hung V Ngo
(74) *Attorney, Agent, or Firm* — Myers Andras Ashman Bisol LLP; Joseph C. Andras

(57)　　　　　　　　ABSTRACT

A RF ("Radio Frequency") shielding container with an associated garment such as a jacket is described. The RF shielding container may comprise a pouch that holds and encapsulates an electronic mobile device such as a cell phone. The pouch is made of multiple layers of fabric including metalized layers that effectively block the reception and/or transmission of RF signals to and from the cell phone. A sealing mechanism formed on the pouch ensures the blockage of RF signals while offering ease of use while in combat. A garment such as a jacket or pants is designed to have internal pockets or cavities which can hold the RF shielding container. The RF shielding container May remain in the jacket during use, as well as when the mobile device is placed into or retrieved from the container.

20 Claims, 12 Drawing Sheets

—101

—10

—201

—260

—210

—201

101

201

—230

250

RF SHIELDING POUCH AND GARMENT FOR ELECTRONIC DEVICES

CROSS-REFERENCE TO RELATED APPLICATIONS

This application is a continuation of non-provisional application Ser. No. 18/126,094, filed Mar. 24, 2023, now pending, the entire specification of which is hereby incorporated by reference in its entirety.

BACKGROUND OF THE INVENTION

1. Field of the Invention

The present invention relates in general to RF ("Radio Frequency") shielding pouches. More particularly, the invention is directed to RF Faraday shielding pouches for mobile devices and their corresponding wearable garments.

2. Description of the Related Art

The need case for RF Faraday shielding pouches with corresponding wearable garments is present in civilian, governmental, and military environments. Everyday citizens have a need for basic privacy reasons. Governmental and elected officials and their agents have a need for secrecy and confidentiality, and sometimes, may have an enhanced need such as when meeting in a Sensitive Compartmented Information Facility (SCIF). Military uses are plentiful as well.

The battlefield, for example, has transcended into a blended environment of traditional warfare and social mobile device exploitation quicker than expected. A simple SMS ("Short Message Service") text to a loved one even outside of the known battlefield has been proven to have extremely grave consequences. Recent world events suggest just how vulnerable electronic devices have become for drone strikes. In one instance, the solders' use of cell phones may have precipitated deadly strikes that resulted in massive casualties. Drones may have been used to monitor cell phone communications that allowed enemy forces to track and determine the coordinates of the soldiers' locations. Moreover, the locations of solders may be detected using thermal imaging technologies, where the solders may be identified based on the contrast of the body temperatures of the solders against an environmental background.

Moreover, as already noted, the need-based applications for RF Faraday shielding pouches and garments extend beyond applications in the battlefield. For example, such RF shielding pouches and garments may be employed to prevent tracking, spying, and hacking of devices used by law enforcement, defense contractors, and forensic investigators. RF shielding pouches and garments could also be used in a medical or hospital environment for privacy or for purposes of preventing interference with sensitive medical equipment, or in conjunction with an airman's flight suit for purposes of helping encourage the airman to properly stow their personal devices when on mission. As privacy issues continue to be top of mind, everyday users also have a need to deploy an RF Faraday shielding pouches and corresponding garments.

Accordingly, a need exists for RF, RFI, and EMI shielding containers and wearable garments.

SUMMARY OF THE INVENTION

In the first aspect, a container configured to be attached to a wearable garment where the container further configured for holding a mobile device that can transmit and/or receive electromagnetic signals is disclosed. The container comprises a pouch adapted to receive and hold a mobile device that can transmit and/or receive electromagnetic signals, the pouch formed from materials having RF shielding properties, the pouch having an interconnected first section for receiving the mobile device and a second section for holding the mobile device. The first section forms an internal passageway having a partial height opening having a first vertical height, the partial height opening adapted to allow the insertion of the mobile device into the pouch when open. The second section extends away from the first section, the second section forming an internal cavity accessible though the passageway of the first section, the internal cavity adapted for holding the mobile device, the second section having a second vertical height which is greater than the first vertical height of the first section. The container further comprises a sealing mechanism coupled to the pouch and adapted to releasably secure the mobile device and to block the reception and/or transmission of electromagnetic signals to and from the mobile device from being detected outside of the pouch.

In a first preferred embodiment, the internal cavity of the second section has one or more radiused corners adapted to guide the mobile device from a horizontal orientation when being placed into the passageway of the first section to a vertical orientation when secured in the internal cavity of the second section. The sealing mechanism preferably comprises a first type of a releasable fastener positioned on a rear surface of the pouch, and a second type of the releasable fastener positioned on a front surface of the pouch, the second type of the releasable fastener adapted to mate and releasably secure to the first type of releasable fastener. The sealing mechanism is preferably formed by double folding the first section onto itself such that the first type of releasable fastener mates with and is releasably secured to the second type of releasable fastener. The first type and the second type of releasable fasteners preferably comprises the hook and loop fastener system sold under the trademark VELCRO®.

The sealing mechanism preferably comprises a first set of two magnetic rib structures formed on a first side of an inner surface of the first section, and a second set of two magnetic rib structures formed on a second side of the inner surface of the first section. The first set of the magnetic rib structures is vertically offset with respect to the second set of the magnetic rib structures, where the first set of the two magnetic rib structures is positioned to interleave and immediately surround the second set of the magnetic rib structures when the first section partial height opening is closed. The sealing mechanism is preferably engaged by urging the first side of the first section onto the second side of the first section to engage the first set of the two magnetic rib structures to the second set of the two magnetic rib structures. The container preferably further comprises a garment attachment panel positioned on a rear surface of the pouch, the garment attachment panel adapted to mate with and releasably secure the container to a garment. The container preferably further comprises a garment attachment panel positioned on a rear surface of the pouch, the garment attachment panel adapted to permanently secure the container to a garment.

The pouch preferably comprises a plurality of fabric layers including a top set of fabric layers comprising a top fabric layer, and a first set of one or more metalized fabric layers attached to at least a full perimeter of the bottom fabric layer. The pouch preferably further comprises a bottom set of fabric layers comprising a second set of one or more metalized layers, and a bottom fabric layer attached to at least a full perimeter of the second set of one or more metalized layers. The top set of fabric layers are preferably attached to the bottom set of fabric layers around a portion of the perimeter of the top and bottom set of fabric layers forming the first section and the second section. The perimeter of the pouch is preferably shaped by a top edge and bottom edge of the first section that extends generally horizontally away from the partial height opening, a top wall of the second section continuously extending generally horizontally from the top edge of the first section further away from the partial height opening, the top edge of the second section expanding upward via an upper curved wall to form an upper second section recess for accommodating an upper portion of a mobile device, a back wall extending from the top wall of the second section obliquely downward and away from the partial height opening for accommodating the side portion of the mobile device. The perimeter is preferably further defined by a bottom wall of the second section extending from the back wall obliquely vertically downward and horizontally toward the partial height opening, the bottom wall for accommodating a bottom portion of the mobile device, and a lower curved wall extending from the bottom wall extending vertically upward and horizontally toward the partial height opening, the lower curved wall connecting continuously with the bottom edge of the first section. The bottom wall and the lower curved wall preferably accommodate a bottom portion of the mobile device. The lower curved wall preferably acts as a pivot when mobile device is positioned in the internal cavity while rotated to a vertical orientation, and the upper curved wall acts as a releasable retaining catch to secure the mobile device within the inner cavity.

In a second aspect, a system comprising a wearable garment and a container configured for holding a mobile device that can transmit and/or receive electromagnetic signals is disclosed. The system comprises a wearable garment comprising an internal garment cavity formed within the garment, the internal garment cavity having a garment cavity opening, a garment fastening patch positioned within the internal garment cavity, the garment fastening patch placed within the internal garment cavity, and a zipper positioned and aligned with the garment cavity opening. The system further comprises a container comprising a pouch adapted to receive and hold a mobile device that can transmit and/or receive electromagnetic signals, the pouch formed from materials having RF shielding properties, the pouch having an interconnected first section for receiving the mobile device and a second section for holding the mobile device. The first section forms an internal passageway having a partial height opening having a first vertical height, the partial height opening adapted to allow the insertion of the mobile device into the pouch when open. The second section extends away from the first section, the second section forming an internal cavity accessible though the passageway of the first section, the internal cavity adapted for holding the mobile device, the second section having a second vertical height which is greater than the first vertical height of the first section. The system further comprises a sealing mechanism coupled to the pouch and adapted to releasably secure the mobile device and to block the reception and/or transmission of electromagnetic signals to and from the mobile device from being detected outside of the pouch, and a garment attachment panel positioned on a rear surface of the pouch, the garment attachment panel adapted to secure the container to the garment fastening patch of the garment.

In a second preferred embodiment, the wearable garment is a jacket. The wearable garment is preferably a pair of pants. The garment attachment panel positioned on a rear surface of the pouch is preferably adapted to mate with and releasably secure the container to a garment fastening patch of the garment. The container preferably further comprises a garment attachment panel positioned on a rear surface of the pouch, the garment attachment panel adapted to permanently secure the container to a garment fastening patch of the garment.

The internal cavity of the second section preferably has one or more radiused corners adapted to guide the mobile device from a horizontal orientation when being placed into the passageway of the first section to a vertical orientation when secured in the internal cavity of the second section. The sealing mechanism preferably comprises a first type of a releasable fastener positioned on a rear surface of the pouch, and a second type of the releasable fastener positioned on a front surface of the pouch, the second type of the releasable fastener adapted to mate and releasably secure to the first type of releasable fastener. The sealing mechanism is preferably engaged by double folding the first section onto itself such that the first type of releasable fastener mates with and is releasably secured to the second type of relation fastener.

The sealing mechanism preferably comprises a first set of two magnetic rib structures formed on a first side of an inner surface of the first section, and a second set of two magnetic rib structures formed on a second side of the inner surface of the first section. The first set of the magnetic rib structures is vertically offset with respect to the second set of the magnetic rib structures, where the first set of the two magnetic rib structures is positioned to interleave and immediately surround the second set of the magnetic rib structures when the first section partial height opening is closed. The sealing mechanism is preferably engaged by urging the first side of the first section onto the second side of the first section to engage the first set of the two magnetic rib structures to the second set of the two magnetic rib structures.

In a third aspect, a system comprising a wearable garment and a container configured for holding a mobile device that can transmit and/or receive electromagnetic signals is disclosed. The system comprises a wearable garment comprising an internal garment cavity formed within the garment, the internal garment cavity having a garment cavity opening, a garment fastening patch positioned within the internal garment cavity, the garment fastening patch placed within the internal garment cavity, and a zipper positioned and aligned with the garment cavity opening. The system further comprises a container comprising a pouch adapted to receive and hold a mobile device that can transmit and/or receive electromagnetic signals, the pouch formed from materials having RF shielding properties, the pouch having an interconnected first section for receiving the mobile device and a second section for holding the mobile device. The first section forms an internal passageway having a partial height opening having a first vertical height, the partial height opening adapted to allow the insertion of the mobile device into the pouch when open. The second section extends away from the first section, the second section forming an internal cavity accessible though the passageway of the first section, the internal cavity adapted for holding the mobile device, the second section having a second vertical height which is greater than the first vertical height of the first section. The perimeter of the pouch is defined by a top edge and bottom edge of the first section that extends generally horizontally away from the partial height opening, a top wall of the second section continuously extending generally horizontally from the top edge of the first section further away from the partial height opening, the top edge of the second section expanding upward via an upper curved wall to form an upper second section recess for accommodating an upper portion of a mobile device, and a back wall extending from the top wall of the second section obliquely downward and away from the partial height opening for accommodating the side portion of the mobile device. The perimeter is further defined by a bottom wall of the second section extending from the back wall obliquely vertically downward and horizontally toward the partial height opening, the bottom wall for accommodating a bottom portion of the mobile device, and a lower curved wall extending from the bottom wall extending vertically upward and horizontally toward the partial height opening, the lower curved wall connecting continuously with the bottom edge of the first section. The perimeter is further defined by the bottom wall and the lower curved wall accommodate a bottom portion of the mobile device. The container further comprises a sealing mechanism coupled to the pouch and adapted to releasably secure the mobile device and to block the reception and/or transmission of electromagnetic signals to and from the mobile device from being detected outside of the pouch, and a garment attachment panel positioned on a rear surface of the pouch, the garment attachment panel adapted to secure the container to the garment fastening patch of the garment.

In a third preferred embodiment, the sealing mechanism comprises a first type of a releasable fastener positioned on a rear surface of the pouch, and a second type of the releasable fastener positioned on a front surface of the pouch, the second type of the releasable fastener adapted to mate and releasably secure to the first type of releasable fastener. The sealing mechanism is formed by double folding the first section onto itself such that the first type of releasable fastener mates with and is releasably secured to the second type of relation fastener.

These and other features and advantages of the invention will become more apparent with a description of preferred embodiments in reference to the associated drawings.

DETAILED DESCRIPTION OF THE PREFERRED EMBODIMENTS

Figures 1, 2:
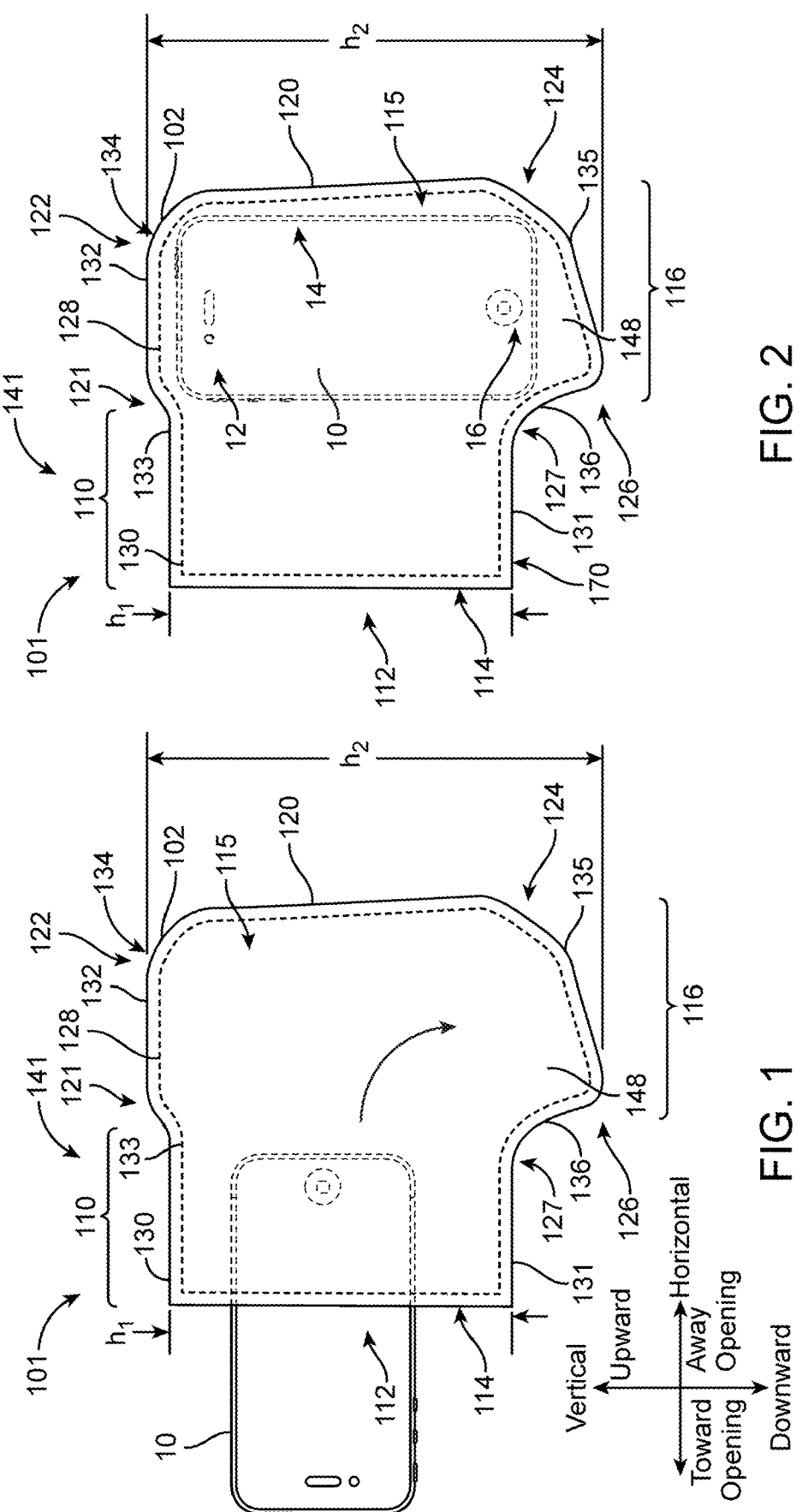
FIG. 1 is a top view of a RF shielding container illustrating the placement of an electronic mobile device into the container in an embodiment.
FIG. 2 is a top view of a RF shielding container covering the electronic mobile device.

Modern warfare has become an environment of traditional warfare enhanced with advanced technologies which can be used by enemy forces to locate and track soldiers in the battlefield. Airmen are at risk due to their devices more than ever based on current tactics in global conflict. As our society and world becomes more dependent on our devices connecting us to everything and everyone, the impact for troops is becoming catastrophic. So much so that militaries ban cell phone use near the front lines. There is a need to protect Airmen from this next level of geolocated target attacks based on Social Media outreaching and simple human interaction via any electronic device.

The inadvertent use of electronic devices by soldiers may have devasting consequences. For example, recent reports suggest that a military volunteer posted multiple pictures of his military base on a social media network Soon after, enemy OSINT analysts geolocated the base and a series of strikes followed, killing dozens of fighters. In another example, mercenaries took a group photo in front of the building they were operating out of and posted it on Telegram. In the top left of the picture, however, is a cutoff address. Soon after, a strike followed, killing the fighters and forcing them to relocate.

In yet another example, soldiers in military barracks were celebrating on New Years when the building came under fire by enemy rockets. The party was attended by hundreds of soldiers and was a hotspot. Many posts were geotagged or were easily identifiable through OSINT investigation, allowing enemy forces to target the site. To date, this event has one of the highest casualty rates of any single strike in the war, with around 100 KIA and hundreds more injured to varying degrees.

A RF ("Radio Frequency") shielding container with an associated wearable garment such as a jacket is contemplated in one or more embodiments. The shielding container may comprise a RF shielding pouch that holds and encapsulates an electronic mobile device such as a cell phone. The pouch-sometimes referred to as a "Faraday Bag"—is made of multiple layers of fabric including metalized layers that effectively block the transmission and reception of RF signals from the cell phone. A garment such as a jacket or pants is designed to have internal pockets or cavities which can hold the RF shielding container. In an embodiment, the RF shielding container remains in the jacket during use, as well as when the cell phone is placed into or retrieved from the container. A jacket having such RF blocking properties may be referred to as a "Faraday Jacket."

The need for RF Faraday shielding pouches and garments extend beyond the battlefield. Other applications may be employed to prevent tracking, spying, and hacking of devices used by law enforcement, defense contractors, forensic investigators, business executives, pilots, and retail customers for privacy.

Embodiments are based on market leading technology that blocks signals to smartphones and mobile devices. Embodiments of the Faraday Jacket helps mitigate signatures that are not being fully addressed, such as RF with the intention of adapting thermal SIGMAN capabilities purposely built into wearables for ease of use to counter surveillance and electromagnetic interference. The end goal is to have a comfortable, breathable, waterproof, fire resistant, RF reducing and thermal blending jacket that can be standard issue for militaries. Chest placement of a smartphone is the easiest to access and most used by airmen. Embodiments have been developed to match emerging technologies that emit and receive Radio Frequencies, such as the latest LTE/4G/5G bands used for cellular and data communications as well as EMP protection exceeding military standards. Embodiments offered commercially come in over 100 different variations of size, material, and color—with all products exceeding MIL-STD-188-125 and IEEE 299-2006 standards for signal blocking effectiveness while reaching an 85-95+Db attenuation at a 40 GHz frequency equating to a 100,000:1 signal reduction effect. By developing a solution for the new emerging threats of environment, RF and thermal detection, the Faraday Jacket will serve as a lifesaving tool for airmen, pilots, and maintainers.

The Faraday jacket is a futuristic upgrade to an outdated wearable garment, keeping airmen truly secure from environmental hazards, RF detection, electromagnetic interference and thermal detection by making their chest a secure location for safe phone storage and easy, quick and integrated access that airmen will actually use.

Embodiments may be used by the flying community need. For example, RF "Signature Control" for Air Mobility Command's SORTIES is a mandatory item that Airmen must adhere to through the mission whether its cargo, refuel, transportation, or touch-and-goes. Airmen are also at risk when they fly over hostile environment environments of relying on equipment on their person. Airmen should not be tracked via personal devices which may give away locations, data, or information that we want kept at proper classification levels. By utilizing embodiments disclosed herein, sensitive data and information can be kept from getting in the hands of adversaries. Moreover, DoD needs endpoint security for all connected devices, and embodiments offer an adaptable easy-to-use physical solution with plans to expand to a "Doomsday" or "Worst Case Scenario" modification. Also, in the event of an Aircrew being behind enemy lines, the OCP Jacket can offer protection. Enhancements to incorporate flame retardant, thermal masking, audio reduction, and selective frequency blocking features are contemplated in one or more embodiments.

Case studies have determined that flight crews are targeted during flying missions. Flight crews are immediately and perpetually targeted via mobile devices as soon as they land in other countries during SORTIES. So much so that flight crews have expressed directed text messages from threats once they land in other countries trying to exploit them personally, financially, and operationally. Embodiments are based on feedback from current users in the field demonstrating an overwhelming need for a form-fitting, easy access, and AFI approved outer garment that instantaneously took Airmen off the digital spectrum to protect themselves from imminent targeted attacks.

Teachings related to the design and construction of RF shielding pouches and the use of magnetic ribs for sealing may be found in U.S. Pat. No. 9,460,309, issued Oct. 4, 2016, entitled "SECURITY POUCH FOR AN ELECTRONIC DEVICE" which is incorporated by reference in its entirety. As used herein, the term "and/or" may be employed as a function word to indicate that either the two words or terms may be taken together or individually.

FIGS. 1 and 2 illustrate a RF shielding container 101 receiving and securing a mobile device 10 such as a cell phone for example. FIG. 1 is a top view of a RF shielding container 101 comprising a pouch 102 which illustrates the placement of an electronic mobile device 10 into the pouch 102 in an embodiment. FIG. 2 is a top view of a RF shielding container covering and encapsulating the electronic mobile device.

The container 101 comprises (1) a RF shielding pouch 102, (2) a sealing mechanism 141 for securing and blocking RF signals from a mobile device 10, and (3) a garment attachment panel 142 (see FIG. 6) which is adapted to attach the container 101 to a garment 201 as described in detail below. In an embodiment, the container 101 is configured to be attached to a wearable garment 201 (see FIG. 3) such as a jacket or a pair of pants for example.

The pouch 102 is adapted to receive and hold a mobile device 10 that can transmit electromagnetic signals. The pouch 102 is formed from materials having RF shielding properties including metalized fabric layers which cause the pouch 102 to exhibit properties of a Faraday bag. A Faraday bag may be formed by a continuous, enveloping covering of a conductive material over a transmitting device which blocks the transmission and/or reception of electromagnetic radiation.

As illustrated in FIG. 1, the pouch 102 comprises a first section 110 having a partial height opening 112 through which a user may insert the mobile device 10 into the pouch 102. The first section 110 is continuously interconnected with a second section 116 for holding the mobile device 10. In an embodiment, the first section 110 forms an internal passageway 114 extending horizontally away from the partial height opening 112. The partial height opening 112 is characterized by a first vertical height $h_1$.

The second section 116 extends away from the first section 110 and forms an internal cavity 115 which is accessible though the internal passageway 114 of the first section 110. As shown in FIG. 2, the internal cavity 115 is adapted to hold the mobile device 10 and is characterized by a second vertical height $h_2$ which is greater than the first vertical height $h_1$ of the first section 110. Having a smaller partial height opening 112 facilitates a RF tight enclosure of the container 101. Moreover, a smaller partial height opening 112 is dimensioned to match the height of commercially-available zippers 230 that may be used on the garment 201.

As described by exemplary embodiments in greater detail below, the pouch 102 has a sealing mechanism 141 (see FIGS. 4 and 10) that is adapted to releasably secure the mobile device 10 and block the transmission of electromagnetic signals from the mobile device 10 from being detected outside of the pouch 102.

The shape of the pouch 102 facilitates quick and easy insertion and removal of mobile devices 10 while in a combat environment. For example, as shown in FIGS. 1 and 2, the internal cavity 115 of the second section 116 has one or more radiused corners 121, 122, 124, 126, and 127 adapted to guide the mobile device 10 from a horizontal orientation when being placed into the passageway 114 of the first section 110 to a vertical orientation when secured in the internal cavity 115 of the second section 116. The curvature of the corners (122 and 124) at the closed end 120 of the pouch 102 is radiused, if not fully radiused into a semicircle, to allow for quick and assured tab-into-a-slot-like insertion into the mating pocket under combat conditions, and to help guide the phone (i.e., mobile device 10) being horizontally inserted into the pouch to make the 90-degree rotation to vertical for containment in the larger height second section 116.

Other features of the shape of the pouch 102 facilitate the quick and easy insertion and removal of mobile devices 10 while in a combat environment. Specifically, the perimeter of the pouch 102 is shaped by a top edge 130 and bottom edge 137 of the first section 110 that extend generally horizontally away from the partial height opening 112. A top wall 132 of the second section 116 continuously extends generally horizontally from the top edge 130 of the first section 110 further away from the partial height opening 112. The top wall 132 of the second section 116 expands the second section 116 upward via an upper curved wall 133 to form an upper second section recess 134 for accommodating an upper portion 12 of a mobile device 10. Hence, the upper curved wall 133 may act as a releasable "retaining catch" to secure the upper portion 12 of the mobile device 10 within the inner cavity 115.

The shape of the bottom portion of the pouch 102 also facilitates the ease of use of the pouch 102. The perimeter is further defined by a back wall 120 that extends from the top wall 132 of the second section 116 obliquely downward and away from the partial height opening 112 for accommodating the side portion of the mobile device 10. The perimeter is further defined by a bottom wall 135 of the second section 116 that extends from the back wall 120 obliquely vertically downward and horizontally toward the partial height opening 112. A lower curved wall 136 extends from the bottom wall 135 vertically upward and horizontally toward the partial height opening 112. The lower curved wall 136 connects continuously with the bottom edge 131 of the first section 110. Hence, the bottom wall 135 and the lower curved wall 136 may accommodate and releasably retain a bottom portion 16 of the mobile device 10. Moreover, the lower curved wall 136 may act as a pivot when mobile device 10 is positioned in the internal cavity 115 while being rotated to a vertical orientation.

Figure 3:
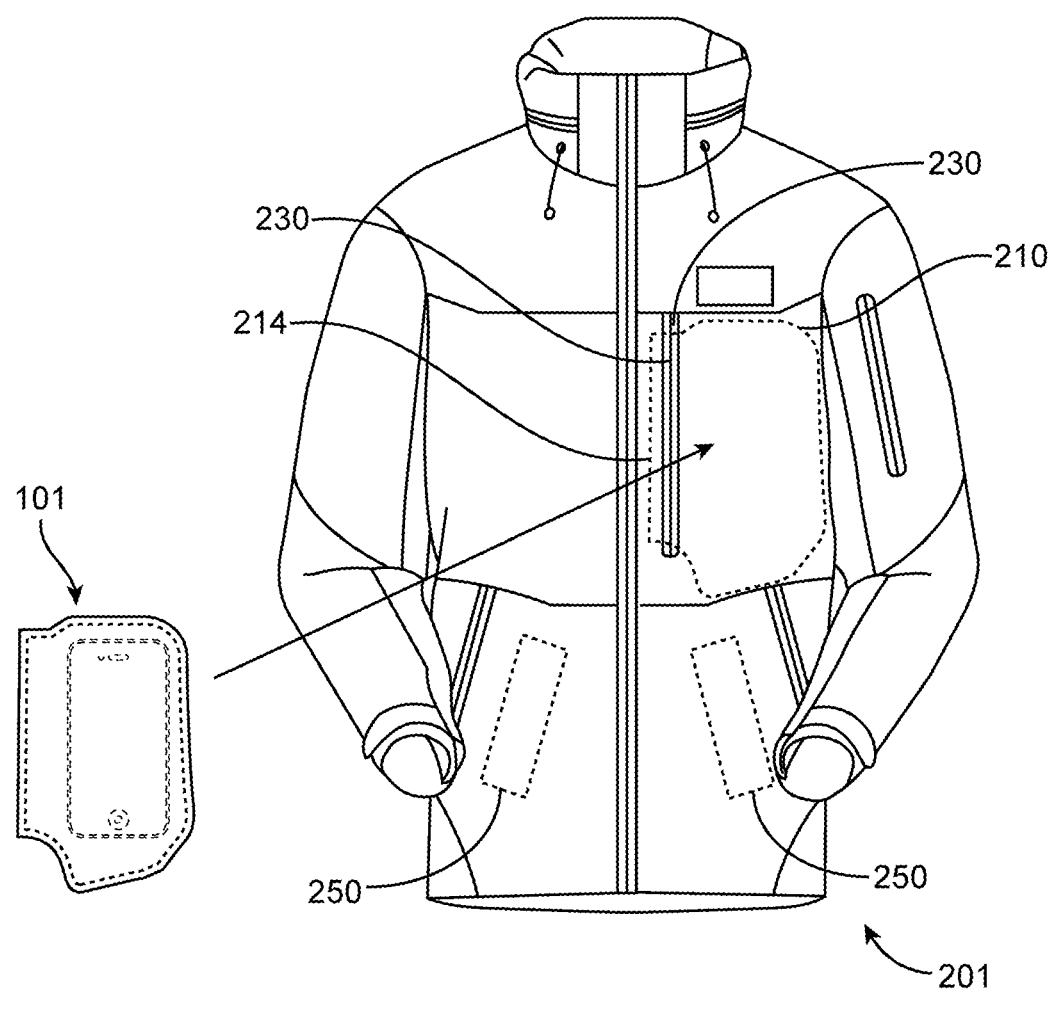
FIG. 3 is a front view showing the RF shielding container being placed into a garment such as a jacket in an embodiment.

FIG. 3 is a front view showing the RF shielding container 101 being placed into a wearable garment 201 such as a jacket in an embodiment. The wearable garment 201 comprises an internal garment cavity 210 formed within the wearable garment 201. The internal garment cavity 210 has a garment cavity opening 214 through which the container 102 may be inserted or removed. A garment fastening patch 212 (see FIG. 11) is positioned within the internal garment cavity 210, such that the garment fastening patch 212 is adapted to secure the container 102 within the internal garment cavity 210. The garment 201 may have a zipper 230 positioned and aligned with the garment cavity opening 214.

Figure 4:
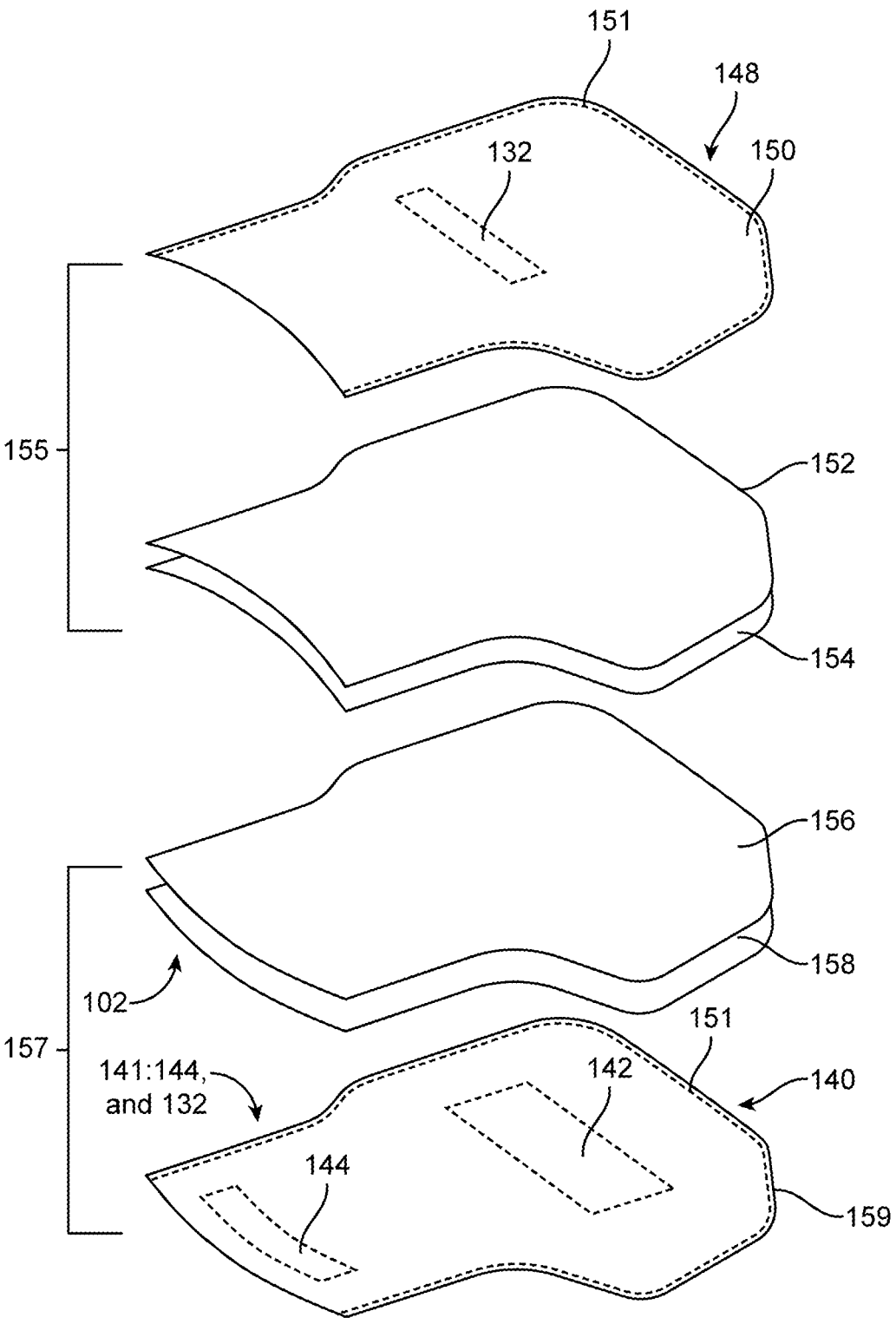
FIG. 4 is a perspective, exploded view of the RF shielding pouch.

FIG. 4 is a perspective, exploded view of the RF shielding pouch 102. The pouch 102 comprises a plurality of fabric layers including a top set of fabric layers 155 comprising a top fabric layer 150 and a first set of one or more metalized fabric layers 152 and 154 attached to at least a full perimeter 151 of the bottom fabric layer. The pouch 102 further comprises a bottom set of fabric layers 157 comprising a second set of one or more metalized layers 156 and 158 and a bottom fabric layer 159 attached to at least a full perimeter 151 of the second set of one or more metalized layers 156 and 158. When assembled, the top set of fabric layers 155 are attached to the bottom set of fabric layers 157 around a portion of the perimeter of the top and bottom set of fabric layers the first section 110 forming the first section 110 having an internal passageway 114 and the second section 116 extends away from the first section 110. It is important to note that metalized fabric layers (152, 154, 156, and 158) create a seal and conductive pouch 102 that seal upon one another to make it RF tight. In an embodiment, the construction is made in a way that rolls the fabric, glues and then sews.

Embodiments of the pouch 102 may be comprised of USA made Faraday materials that are MIL-ST-D-188-125-2 compliant and exceeds IEEE 299-2006 (1-40 GHZ) standards. Embodiments of the container 101 instantly block electromagnetic radiation signals from cellular, EMF ("Electromagnetic Fields"), Wi-Fi, key fobs, Bluetooth, RFID/NFC ("Radio Frequency Identification/Near Field Communications"), GPS, Sat. Nav. EMP ("Electromagnetic Pulse")/HEMP, and solar flares.

Figures 5, 6:
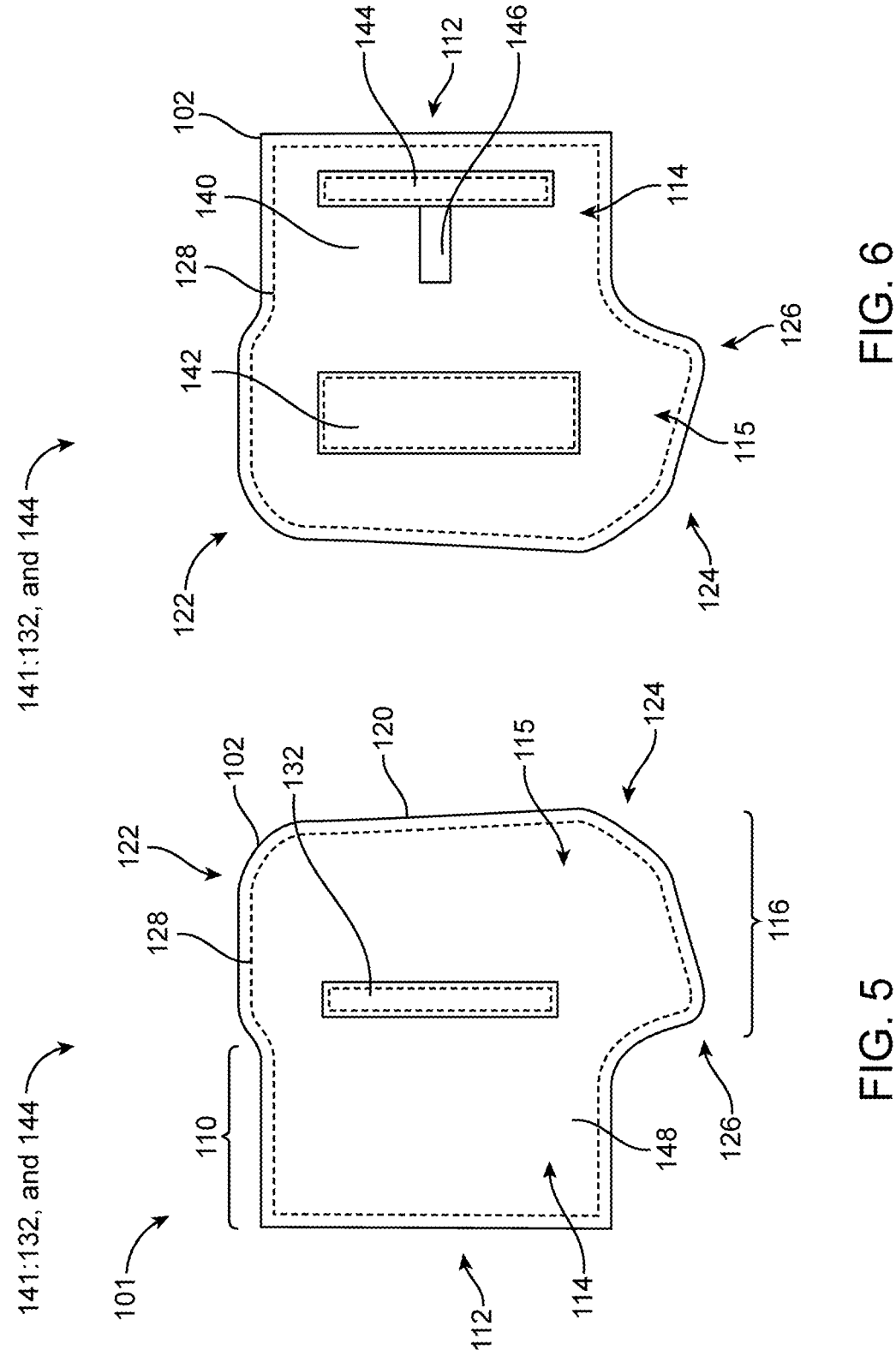
FIG. 5 is a view of the top surface of the RF shielding container.
FIG. 6 is a view of the bottom surface of the RF shielding container.

FIGS. 5 and 6 are top and rear views of the of the RF shielding container 101 illustrating the sealing mechanism 141 in an embodiment. The sealing mechanism 141 comprises a first type of a releasable fastener 144 positioned on a rear surface 140 of the pouch 102, and a second type of the releasable fastener 132 positioned on a front surface 148 of the pouch 102. The second type of the releasable fastener 132 is adapted to mate with and releasably secure to the first type of releasable fastener 144.

FIG. 6 also illustrates a garment attachment panel 142 positioned on a rear surface 140 of the pouch 102, where the garment attachment panel 142 is adapted to mate with and releasably secure the container 101 to a wearable garment 201 in an embodiment. The garment attachment panel 142 may also be adapted to permanently secure the container 101 to a wearable garment 201. FIG. 6 also illustrates a loop 146 made of fabric placed on the rear surface 140 of the pouch 102 which facilitates the user to manipulate the pouch 102 for closing or opening the pouch 102.

Figures 7, 8, 9:
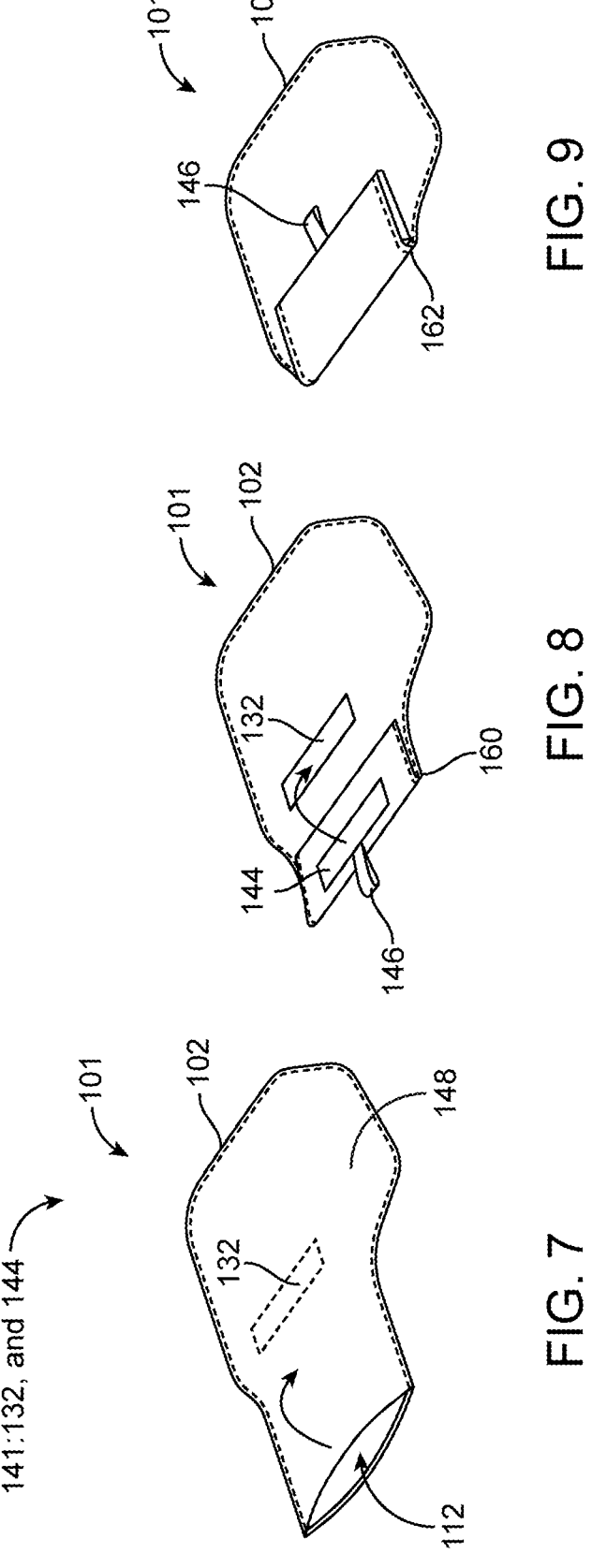
FIG. 7 is a perspective view illustrating the step of creating a first fold in the RF shielding pouch.
FIG. 8 is a perspective view illustrating the step of creating a double fold in the RF shielding pouch.
FIG. 9 is a perspective view of the RF shielding pouch secured for fully encapsulating a mobile device.

As shown in FIGS. 7-9, the sealing mechanism 141 is formed by double folding the first section 110 onto itself such that the first type of releasable fastener 144 mates with and is releasably secured to the second type of releasable fastener 132. Employing a double fold provides a stronger block of electromagnetic signals from the mobile device 10 from being detected in the field. In an embodiment, the first type and second type of releasable fasteners 144 and 132 comprises the hook and loop fastener system sold under the trademark VELCRO®.

Figure 10:
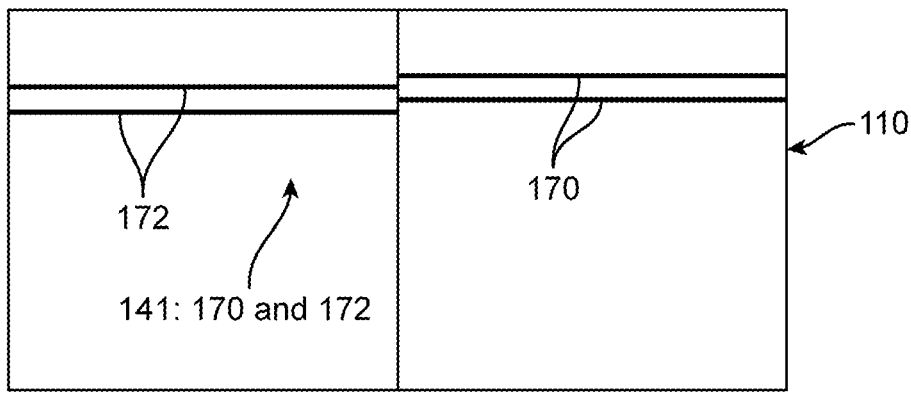
FIG. 10 is a representation of magnetic ribs which serve to seal a RF shielding pouch.

FIG. 10 is a representation of magnetic ribs 170 and 172 which serve to seal a RF shielding pouch 102. The magnetic ribs 170 and 172 may be a piping of magnetic material formed across the inner surfaces of the pouch 102 near the partial height opening 112. In an embodiment, the sealing mechanism 141 comprises a first set 172 of two magnetic rib structures formed on a first side of an inner surface of the first section 110, and a second set 170 of two magnetic rib structures formed on a second side of the inner surface of the first section 110. The first set 172 of the magnetic rib structures is vertically offset with respect to the second set 170 of the magnetic rib structures, where the first set 172 of the two magnetic rib structures is positioned to interleave and immediately surround the second set 170 of the magnetic rib structures when the first section 110 partial height opening 112 is closed. The sealing mechanism 141 is engaged by urging the first side 148 of the first section onto the second side of the first section 110 to engage the first set 172 of the two magnetic rib structures to the second set 170 of the two magnetic rib structures. In an embodiment, a quick fold over seal as a redundant blocking method is employed. Internally the materials are folded to one side glued and then stitched (opposed to just flat sewing).

Figure 11:
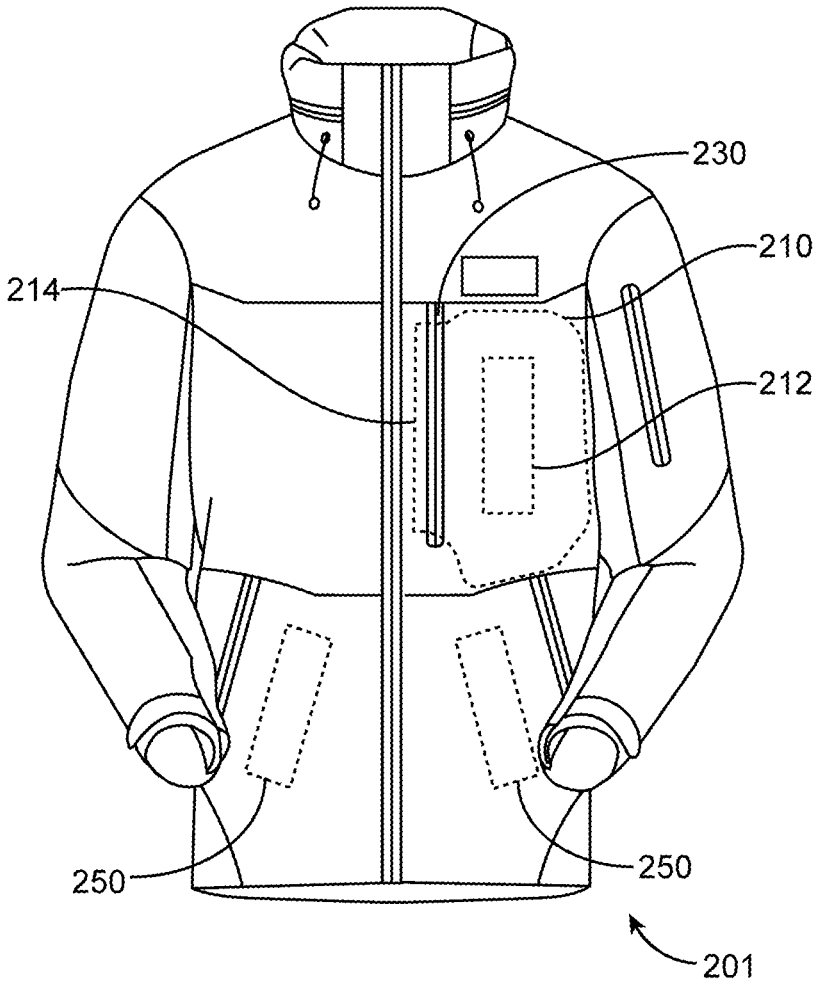
FIG. 11 is a front view of a garment for holding the RF shielding container.

FIG. 11 is a front view of a wearable garment 201 for holding the RF shielding container 101. The wearable garment 201 comprises an internal garment cavity 210 formed within the wearable garment 201. The internal garment cavity 210 has a garment cavity opening 214. A garment fastening patch 212 is positioned within the internal garment cavity 210, where the garment fastening patch 212 is adapted to secure the container 102 within the internal garment cavity 210. The garment 201 may have a zipper 230 positioned and aligned with the garment cavity opening 214.

Embodiments of the wearable garment 201 comprising a jacket are constructed from highly durable and weather resistant Ripstock Nylon. Embodiments of the jacket may have a stowable rain hood, adjustable wrist loops, YKK Zippers, as well as soft loop lined pockets for seamless VELCRO® accessory attachment such as by securing the loop 146 of the container 102.

Referring back to FIG. 6, the pouch 102 has a garment attachment panel 142 positioned on a rear surface 140 of the pouch 102. The garment attachment panel 142 is adapted to releasably attach to the garment fastening patch 212 of the garment 201, allowing instant and seamless ability to go off-the-grid. Moreover, having a releasable means to remove the container 101 allows a user to readily replace a damaged container 101, where damage may result from the hard case of the mobile device 10 abrading the metallic fabric and compromising the RF-blocking nature of the pouch 102.

Hence, a user may place a mobile device 10 into the container 101, and the container 101 into jacket 201, as follows. First, the user inserts the mobile device 10 into the partial height opening 112 horizontally (see FIG. 1), pushes the device 10 into the section 116, and then rotates mobile device 10 vertically (see FIG. 2). Second, the user then folds the first section 110 over a first time (see FIG. 8), and then folds the first section 110 over for a second time to create a double fold (see FIG. 9). Third, the user unzips the zipper 230 on the jacket 201, and places the container 101 into the pocket 210. The container 101 is held within the pocket 201 via the garment attachment panel 142 of the container 101 releasably bonding with the garment fastening patch 212 on the jacket 201 (see FIG. 11). Fourth, the user then closes the zipper 230 to enclose the container 101 in the pocket 210.

In an embodiment designed to allow the removal of the container 101 from the pocket 210, the garment attachment panel 142 and the garment fastening patch 212 may comprise the hook and loop fastener system sold under the trademark VELCRO®. The use of a VELCRO® panel on the rear surface 140 of the pouch 102 ensures that the pouch 102 generally stays in the pocket and does not easily fall out if the pocket 210 is not closed under combat conditions.

In an embodiment, the mating VELCRO® inside the pocket (i.e., internal cavity 210) could be on both sides of the pocket 210. However, having the pouch 102 secured on one side of the pocket may be preferred so that the front jacket 201 panel doesn't bunch up or abrade. Moreover, two points of connections may provide too much retention of the pouch 102 in the pocket.

Embodiments designed to allow the removal of the container 101 from the pocket 210 may employ one or magnets for the garment attachment panel 142 and the garment fastening patch 212. For example, both the garment attachment panel 142 and the garment fastening patch 212 may each comprise a magnet or a magnetized material. In another example, one of the fastening components comprising the garment attachment panel 142 and the garment fastening patch 212 may comprise a magnet—but not both—where the other fastening component may comprise a metal such as a ferromagnetic metal such as iron, cobalt, and nickel. The magnetic approach may prove more desirable than other approaches, such as hook and loop fasteners, because the container 101 may be more freely and less attentively inserted into the pocket 210, and the magnetic fastening components will natively and automatically draw the container 101 toward and then locate it at the final desired home position within the pocket 210.

The user may access the mobile device 10 by one of two ways. First, the user has the ability to remove the container 101 from the pocket (i.e., internal cavity 210) by unzipping the zipper 230, retrieving the container 101 from the pocket 210 thus releasing the bond between the garment attachment panel 142 of the container 101 and garment fastening patch 212 on the garment 201, and then retrieving the mobile device 10 from the container 102. Alternatively, the user may retrieve the mobile device 10 without removing the container 102 from the garment 201 by unzipping the zipper 230, reaching and releasing the sealing mechanism 141, and retrieving the mobile device 10.

In an embodiment, the garment attachment panel 142 may also be adapted to permanently or semi-permanently connect the container 101 to a wearable garment 201. In an embodiment, the connection between the container 101 and the pocket (i.e., internal cavity 210) could be formed by a strap, cord, or panel to the interior of the jacket pocket 210 such that the container 102 is not detachable or at least not easily detachable. In an embodiment, the container 102 may be even more closely integrated where the container 102 is sewn into and more closely integrated with the interior of the pocket 210 so that the container 102 does not actually come out at all, but rather slides out in a drawer-like manner.

Figure 12:
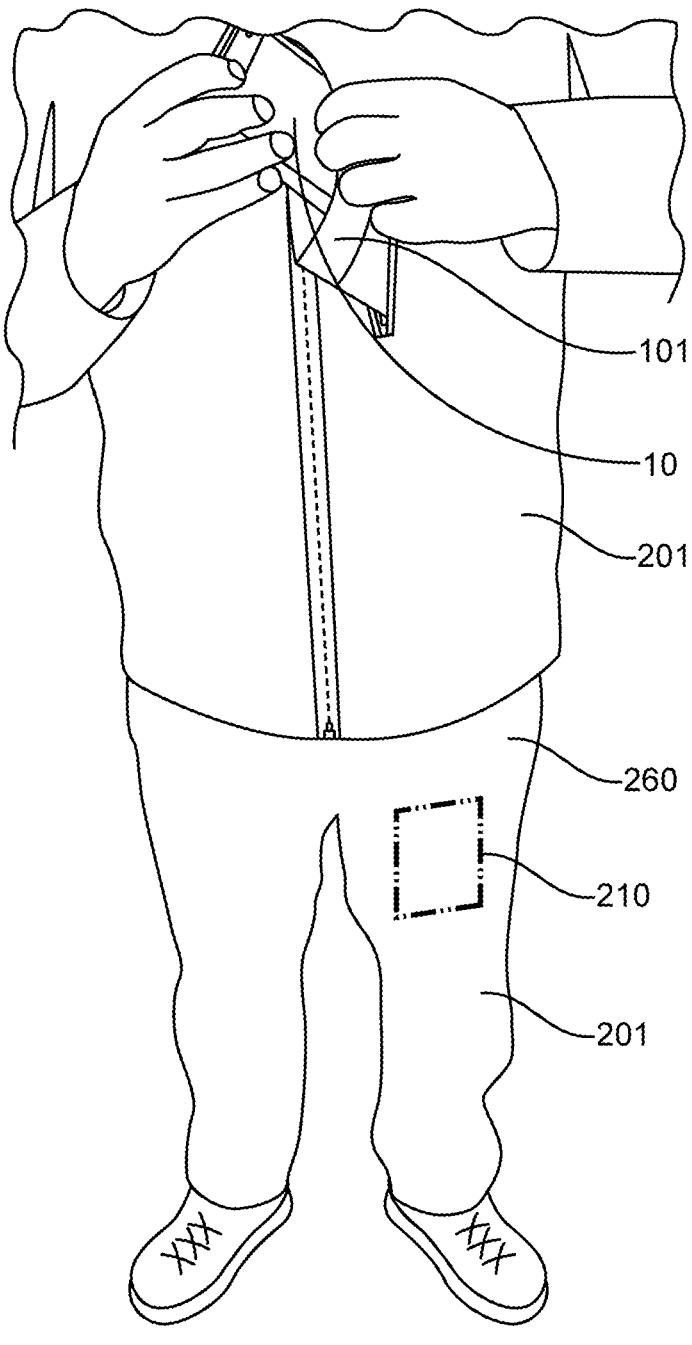
FIG. 12 is a front view of a user placing a mobile device in the RF shielding container positioned in the jacket.
Figure 13:
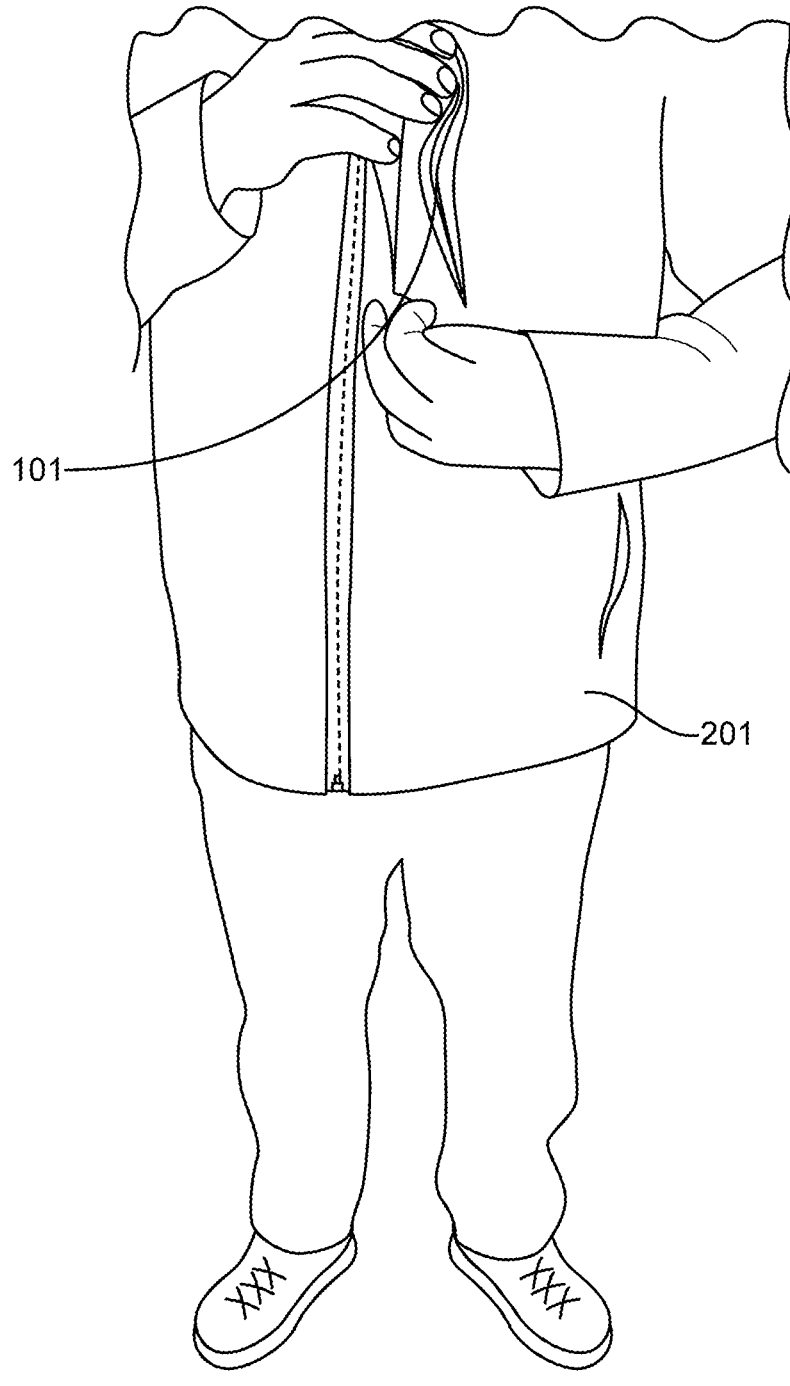
FIG. 13 is a front view of the user creating a double fold in the RF shielding pouch.
Figure 14:
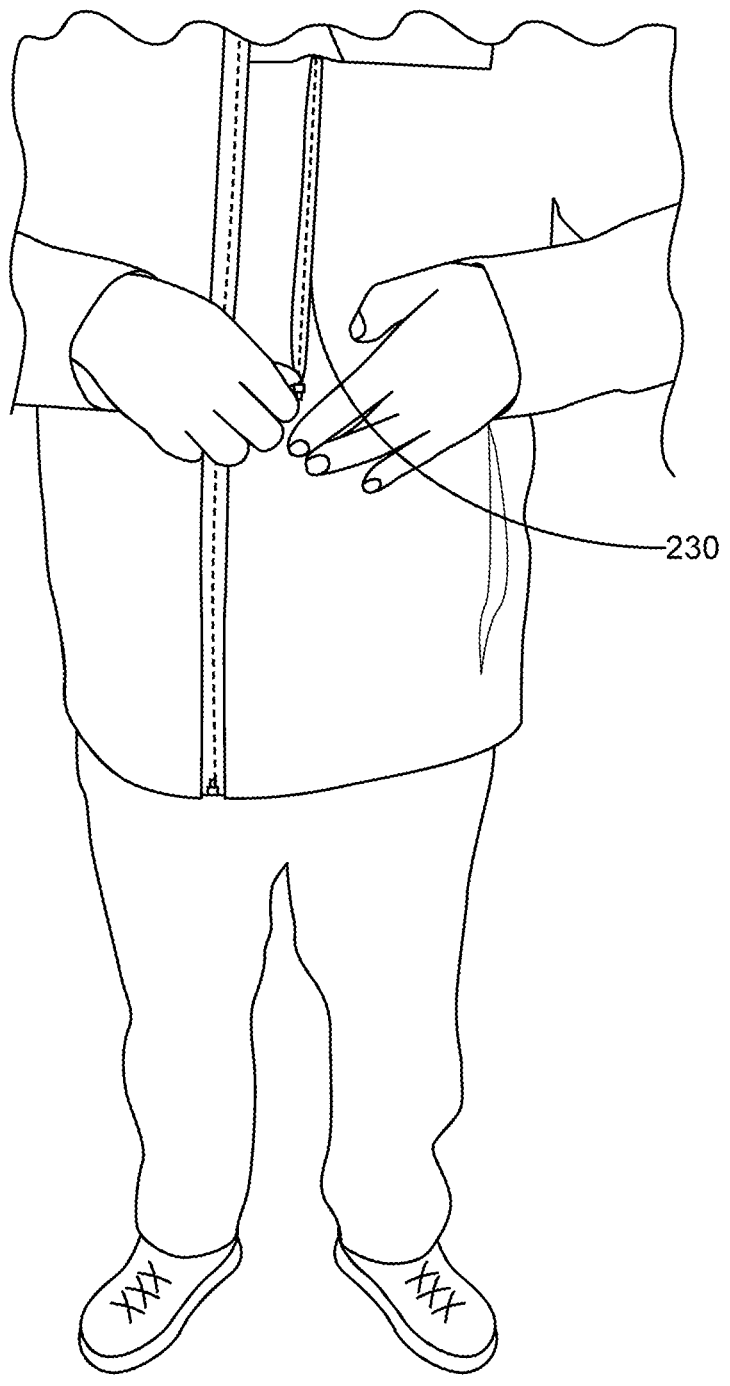
FIG. 14 is a front view of the user securing the container in jacket by moving the zipper not a closed position.
Figure 15:
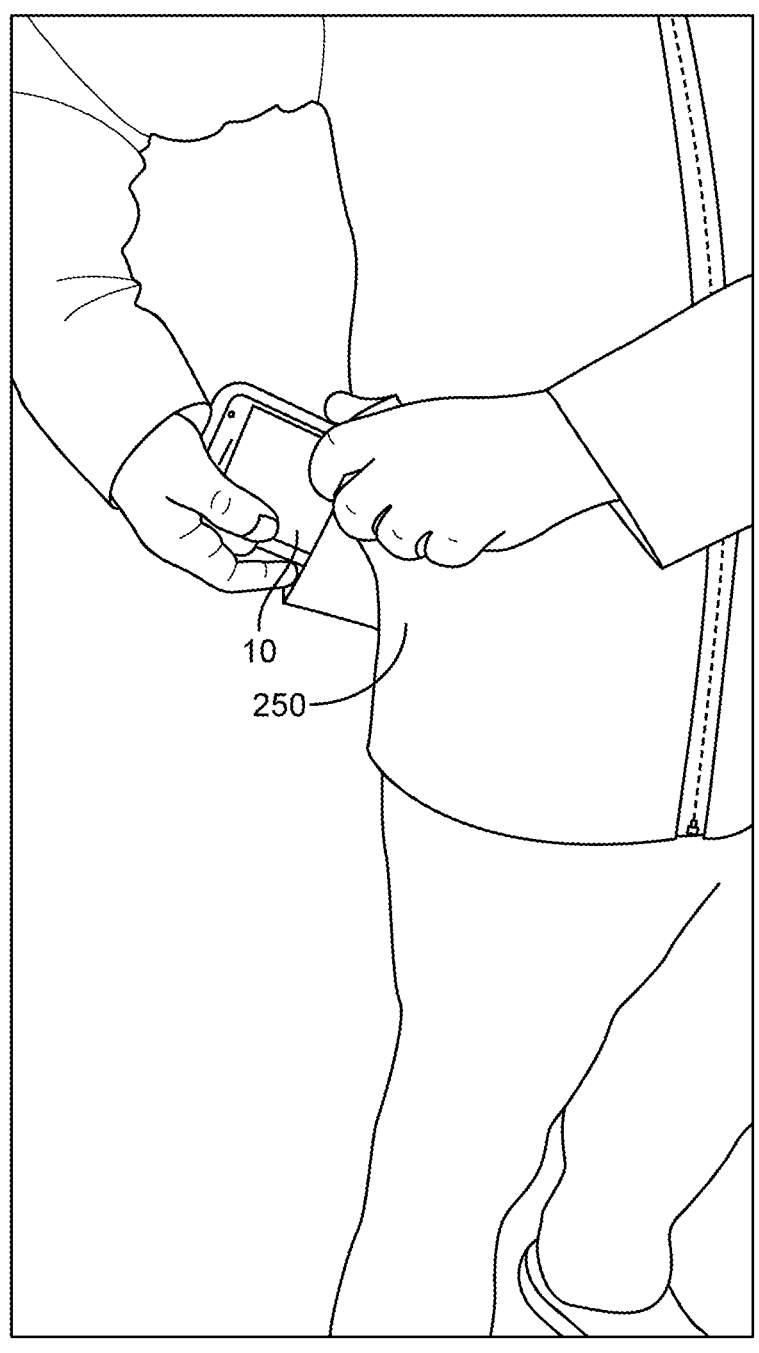
FIG. 15 is a front view of the user placing the mobile device into a lower jacket pocket.
Figure 16:
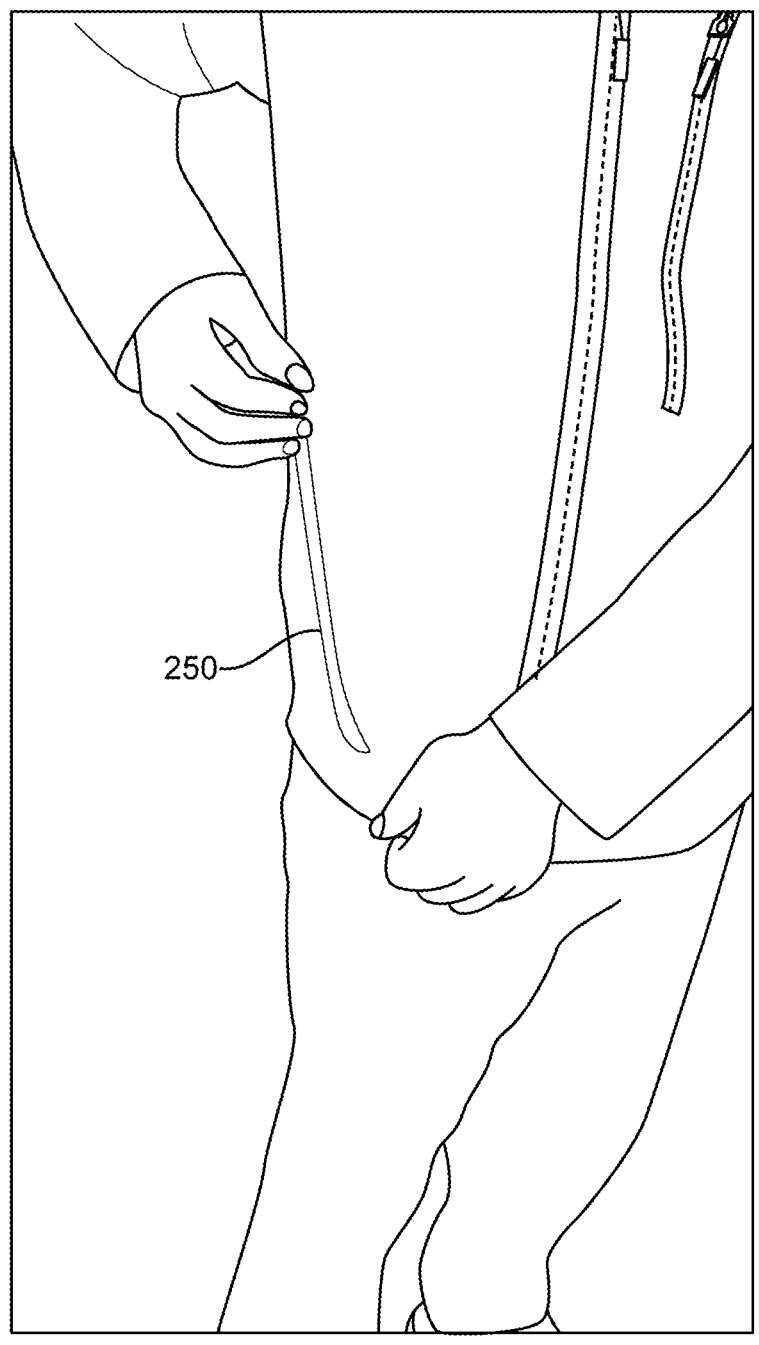
FIG. 16 is a front view of the user securing the mobile device in the lower jacket pocket.

FIGS. 12-16 illustrate a user placing and retrieving of a mobile device 10 such as a cell phone in a wearable garment 201. FIG. 12 is a front view of a user placing a mobile device 10 in the RF shielding container 102 positioned in wearable garment 201 comprising a jacket. FIG. 12 also schematically illustrates a wearable garment 201 as a pair of pants in an embodiment. FIG. 13 is a front view of the user creating a double fold in the RF shielding pouch 102. FIG. 14 is a front view of the user securing the container 101 in jacket 201 by moving the zipper to a closed position. FIG. 15 is a front view of the user placing the mobile device into a lower jacket pocket. FIG. 16 is a front view of the user securing the mobile device in the lower jacket pocket.

Although the invention has been discussed with reference to specific embodiments, it is apparent and should be understood that the concept can be otherwise embodied to achieve the advantages discussed. The preferred embodiments above have been described primarily as RF shielding containers and their associated garments. In this regard, the foregoing description of the RF shielding container is presented for purposes of illustration and description.

Furthermore, the description is not intended to limit the invention to the form disclosed herein. Accordingly, variants and modifications consistent with the following teachings, skill, and knowledge of the relevant art, are within the scope of the present invention. The embodiments described herein are further intended to explain modes known for practicing the invention disclosed herewith and to enable others skilled in the art to utilize the invention in equivalent, or alternative embodiments and with various modifications considered necessary by the particular application(s) or use(s) of the present invention.

What is claimed is:

1. A container configured to be attached to a wearable garment, the container further configured for holding a mobile device that can transmit and/or receive electromagnetic signals, the container comprising:

a pouch adapted to receive and hold a mobile device that can transmit and/or receive electromagnetic signals, the pouch formed from materials having RF shielding properties, the pouch having an interconnected first section for receiving the mobile device and a second section for holding the mobile device; wherein the first section forms an internal passageway having a partial height opening having a first vertical height, the partial height opening adapted to allow the insertion of the mobile device into the pouch when open; and, the second section extends away from the first section, the second section forming an internal cavity accessible though the passageway of the first section, the internal cavity adapted for holding the mobile device, the second section having a second vertical height which is greater than the first vertical height of the first section.

2. The container configured to be attached to the wearable garment, the container further configured for holding the mobile device that can transmit and/or receive electromagnetic signals of claim 1, wherein the internal cavity of the second section has one or more radiused corners adapted to guide the mobile device from a horizontal orientation when being placed into the passageway of the first section to a vertical orientation when secured in the internal cavity of the second section.

3. The container configured to be attached to the wearable garment, the container further configured for holding the mobile device that can transmit and/or receive electromagnetic signals of claim 1, further comprising:

a sealing mechanism coupled to the pouch and adapted to releasably secure the mobile device and to block the reception and/or transmission of electromagnetic signals to or from the mobile device from being detected outside of the pouch.

4. The container configured to be attached to the wearable garment, the container further configured for holding the mobile device that can transmit and/or receive electromagnetic signals of claim 1, wherein the sealing mechanism comprises:

a first type of a releasable fastener positioned on a rear surface of the pouch; and, a second type of the releasable fastener positioned on a front surface of the pouch, the second type of the releasable fastener adapted to mate and releasably secure to the first type of releasable fastener;

wherein the sealing mechanism is formed by double folding the first section onto itself such that the first type of releasable fastener mates with and is releasably secured to the second type of releasable fastener.

5. The container configured to be attached to the wearable garment, the container further configured for holding the mobile device that can transmit and/or receive electromagnetic signals of claim 4, wherein the first type and the second type of releasable fasteners comprises the hook and loop fasteners system sold under the trademark VELCRO®.

6. The container configured to be attached to the wearable garment, the container further configured for holding the mobile device that can transmit and/or receive electromagnetic signals of claim 1 further comprising:

a garment attachment panel positioned on a rear surface of the pouch, the garment attachment panel adapted to mate with and releasably secure the container to a garment.

7. The container configured to be attached to the wearable garment, the container further configured for holding the mobile device that can transmit and/or receive electromagnetic signals of claim 1 further comprising:

a garment attachment panel positioned on a rear surface of the pouch, the garment attachment panel adapted to permanently secure the container to a garment.

8. The container configured to be attached to the wearable garment, the container further configured for holding the mobile device that can transmit and/or receive electromagnetic signals of claim 1, wherein:

the pouch comprises a plurality of fabric layers including:

a top set of fabric layers comprising: a top fabric layer; and a first set of one or more metalized fabric layers attached to at least a full perimeter of the bottom fabric layer; and, a bottom set of fabric layers comprising:

a second set of one or more metalized layers; and a bottom fabric layer attached to at least a full perimeter of the second set of one or more metalized layers, wherein the top set of fabric layers are attached to the bottom set of fabric layers around a portion of the perimeter of the top and bottom set of fabric layers forming the first section and the second section.

9. The container configured to be attached to the wearable garment, the container further configured for holding the mobile device that can transmit and/or receive electromagnetic signals of claim 1, wherein the perimeter of the pouch is shaped by:

a top edge and bottom edge of the first section that extends generally horizontally away from the partial height opening;

a top wall of the second section continuously extending generally horizontally from the top edge of the first section further away from the partial height opening, the top edge of the second section expanding upward via an upper curved wall to form an upper second section recess for accommodating an upper portion of a mobile device;

a back wall extending from the top wall of the second section obliquely downward and away from the partial height opening for accommodating the side portion of the mobile device;

a bottom wall of the second section extending from the back wall obliquely vertically downward and horizontally toward the partial height opening, the bottom wall for accommodating a bottom portion of the mobile device; and, a lower curved wall extending from the bottom wall extending vertically upward and horizontally toward the partial height opening, the lower curved wall connecting continuously with the bottom edge of the first section, wherein the bottom wall and the lower curved wall accommodate a bottom portion of the mobile device.

10. The container configured to be attached to the wearable garment, the container further configured for holding the mobile device that can transmit and/or receive electromagnetic signals of claim 9, wherein:

the lower curved wall acts as a pivot when mobile device is positioned in the internal cavity while rotated to a vertical orientation; and the upper curved wall acts as a releasable retaining catch to secure the mobile device within the inner cavity.

11. A system comprising a wearable garment and a container configured for holding a mobile device that can transmit and/or receive electromagnetic signals, the system comprising:

a wearable garment comprising:

an internal garment cavity formed within the garment, the internal garment cavity having a garment cavity opening;

a garment fastening patch positioned within the internal garment cavity, the garment fastening patch placed within the internal garment cavity; and, a container comprising:

a pouch adapted to receive and hold a mobile device that can transmit electromagnetic signals;

a sealing mechanism coupled to the pouch and adapted to releasably secure the mobile device and to block the reception and/or transmission of electromagnetic signals to and from the mobile device from being detected outside of the pouch; and a garment attachment panel positioned on a rear surface of the pouch, the garment attachment panel adapted to secure the container to the garment fastening patch of the garment;

wherein the sealing mechanism comprises:

a first set of two magnetic rib structures formed on a first side of an inner surface of the first section; and, a second set of two magnetic rib structures formed on a second side of the inner surface of the first section, wherein the first set of the magnetic rib structures is vertically offset with respect to the second set of the magnetic rib structures, the first set of the two magnetic rib structures positioned to interleave and immediately surround the second set of the magnetic rib structures when the first section partial height opening is closed, wherein the sealing mechanism is engaged by urging the first side of the first section onto the second side of the first section to engage the first set of the two magnetic rib structures to the second set of the two magnetic rib structures.

12. The system comprising the wearable garment and the container configured for holding the mobile device that can transmit and/or receive electromagnetic signals of claim 11, wherein the wearable garment comprising further comprises a zipper positioned and aligned with the garment cavity opening.

13. The system comprising the wearable garment and the container configured for holding the mobile device that can transmit and/or receive electromagnetic signals of claim 11, wherein the shape of the pouch facilitates quick and easy insertion and removal of mobile device while the wearable garment is being worn by the user.

14. The system comprising the wearable garment and the container configured for holding the mobile device that can transmit and/or receive electromagnetic signals of claim 11, wherein the sealing mechanism is formed while the wearable garment is being worn by the user.

15. The system comprising the wearable garment and the container configured for holding the mobile device that can transmit and/or receive electromagnetic signals of claim 11, wherein the wearable garment is a jacket.

16. The system comprising the wearable garment and the container configured for holding the mobile device that can transmit and/or receive electromagnetic signals of claim 11, wherein the wearable garment is a pair of pants.

17. The system comprising the wearable garment and the container configured for holding the mobile device that can transmit and/or receive electromagnetic signals of claim 11 wherein the garment attachment panel positioned on a rear surface of the pouch is adapted to mate with and releasably secure the container to a garment fastening patch of the garment.

18. The system comprising the wearable garment and the container configured to be attached to the wearable garment, the container further configured for holding the mobile device that can transmit and/or receive electromagnetic signals of claim 11 further comprising:

a garment attachment panel positioned on a rear surface of the pouch, the garment attachment panel adapted to permanently secure the container to a garment fastening patch of the garment.

19. A system comprising a wearable garment and a container configured for holding a mobile device that can transmit electromagnetic signals, the system comprising:

a wearable garment comprising:

an internal garment cavity formed within the garment, the internal garment cavity having a garment cavity opening;

a garment fastening patch positioned within the internal garment cavity, the garment fastening patch placed within the internal garment cavity; and, a container comprising:

a pouch adapted to receive and hold a mobile device that can transmit electromagnetic signals, wherein the shape of the pouch facilitates quick and easy insertion and removal of the mobile device while the wearable garment is being worn by the user;

a sealing mechanism coupled to the pouch and adapted to releasably secure the mobile device and to block the reception and/or transmission of electromagnetic signals to and from the mobile device from being detected outside of the pouch; and a garment attachment panel positioned on a rear surface of the pouch, the garment attachment panel adapted to secure the container to the garment fastening patch of the garment;

wherein the sealing mechanism comprises:

a first type of a releasable fastener positioned on a rear surface of the pouch; and, a second type of the releasable fastener positioned on a front surface of the pouch, the second type of the releasable fastener adapted to mate and releasably secure to the first type of releasable fastener;

wherein the sealing mechanism is formed by double folding the first section onto itself such that the first type of releasable fastener mates with and is releasably secured to the second type of releasable fastener.

20. The system comprising the wearable garment and the container configured for holding a mobile device that can transmit electromagnetic signals of claim 19, wherein the wearable garment further comprises a zipper positioned and aligned with the garment cavity opening.

* * * * *